United States Patent
McAuliffe et al.

(10) Patent No.: US 6,367,047 B1
(45) Date of Patent: Apr. 2, 2002

(54) MULTI-LEVEL ERROR DETECTION AND CORRECTION TECHNIQUE FOR DATA STORAGE RECORDING DEVICE

(75) Inventors: Richard H. McAuliffe, Boulder; Thomas E. Zaczek, Louisville, both of CO (US)

(73) Assignee: Ecrix, Boulder, CO (US)

( * ) Notice: Subject to any disclaimer, the term of this patent is extended or adjusted under 35 U.S.C. 154(b) by 0 days.

(21) Appl. No.: 09/176,014

(22) Filed: Oct. 20, 1998

(51) Int. Cl.[7] .............................................. H03M 13/29
(52) U.S. Cl. ....................... 714/755; 714/758; 714/769; 714/771
(58) Field of Search ................................ 714/755, 756, 714/766, 769, 771

(56) References Cited

U.S. PATENT DOCUMENTS

| | | | |
|---|---|---|---|
| 3,821,710 A | 6/1974 | Arciprete et al. | 340/172.5 |
| 3,962,727 A | 6/1976 | Kamimura et al. | 360/85 |
| 4,011,587 A | 3/1977 | Arter et al. | 360/62 |
| 4,099,211 A | 7/1978 | Hathaway | 360/109 |
| 4,106,065 A | 8/1978 | Ravizza | 360/109 |
| 4,125,881 A | 11/1978 | Eige et al. | 360/50 |
| 4,172,265 A | 10/1979 | Sakamoto et al. | 360/70 |
| 4,175,267 A | 11/1979 | Tachi | 358/4 |
| 4,215,377 A | 7/1980 | Norris | 360/73 |
| 4,257,075 A | 3/1981 | Wysocki et al. | 360/96.5 |
| 4,293,879 A | 10/1981 | Heitmann et al. | 360/10 |
| 4,357,639 A | 11/1982 | Hama et al. | 360/85 |
| 4,390,915 A | 6/1983 | Matsuyama | 360/104 |

(List continued on next page.)

FOREIGN PATENT DOCUMENTS

| | | |
|---|---|---|
| DE | 29 06 836 A1 | 9/1980 |
| EP | 0466296 | 1/1992 |
| JP | 56-93157 | 7/1981 |
| JP | 58-133665 | 2/1982 |
| JP | 57-55579 | 4/1982 |
| JP | 59-139157 | 1/1983 |

OTHER PUBLICATIONS

Pizzi, New Audio Recording Formats, Broadcast Engineering, Feb. 1993, paragraph. 60–63.

NT-1, Apr. 1992.

Sasake, T., Asltad, J., Younker, M., The NT Digital Mcro Tape Recorder, Goddard Conference on Mass Storage Systems and Technologies, Sep. 22–24, 1992, paragraph. 143–157.

Ohta et al., "A Cell Loss Recovery Method Using FEC in ATM Networks", 8272 IEEE Journal on Selected Areas in Communications, Dec. 9, 1991, No. 9, New York, US, pp1471–1483.

Oguz et al., "Performance Analysis of Two–Level Forward Error Correction for Lost Cell Recovery in ATM Networks", BNSDOCID: <XP 000580642>, Feb. 4, 1995, pp728–737.

Farrell, "A Survey of Array Error Control Codes", European Transactions on Telecommunications and Related Technologies, 3(1992)Sep./Oct., No. 5, Milano, IT, pp441–454.

*Primary Examiner*—Stephen M. Baker
(74) *Attorney, Agent, or Firm*—The Law Offices of Jessica Clement, PC (57) ABSTRACT

A multi-level error correction technique for maintaining data integrity in a data recording/recovery device is presented. Data is stored in buffer packets in a segment of a data buffer before being recorded to a storage medium. Error correction codes are generated over a plurality of instances of a plurality of buffer packet patterns in the segment, and are recorded along with all of the buffer packets onto a storage medium. During data recovery from the storage medium, recovered error correction code packets are used to perform multi-level segment correction on the recovered data packets.

13 Claims, 6 Drawing Sheets

U.S. PATENT DOCUMENTS

| | | | |
|---|---|---|---|
| 4,394,694 A | 7/1983 | Ninomiya et al. | 360/14.3 |
| 4,404,605 A | 9/1983 | Sakamoto | 360/77 |
| 4,412,260 A | 10/1983 | Stricklin et al. | 360/97 |
| 4,420,778 A | 12/1983 | Sakamoto | 360/77 |
| 4,467,373 A | 8/1984 | Taylor et al. | 360/38.1 |
| 4,484,236 A | 11/1984 | Wilkinson | 360/10.3 |
| 4,486,796 A | 12/1984 | Sakamoto | 360/77 |
| 4,491,886 A | 1/1985 | Saito et al. | 360/85 |
| 4,492,991 A | 1/1985 | Osada et al. | 360/70 |
| 4,544,967 A | 10/1985 | Louth | 360/77 |
| 4,554,598 A | 11/1985 | Tarbox et al. | 360/48 |
| 4,564,945 A * | 1/1986 | Glover et al. | 371/38 |
| 4,581,662 A | 4/1986 | Sato | 360/75 |
| 4,609,947 A | 9/1986 | Yamagiwa et al. | 358/310 |
| 4,614,991 A | 9/1986 | Murakami | 360/137 |
| 4,620,245 A | 10/1986 | Shimizu | 360/85 |
| 4,628,372 A | 12/1986 | Morisawa | 360/40 |
| 4,628,383 A | 12/1986 | Miyamoto | 360/96.5 |
| 4,636,873 A | 1/1987 | Eguchi | 360/8 |
| 4,637,023 A | 1/1987 | Lounsbury et al. | 371/38 |
| 4,641,210 A | 2/1987 | Ohyama | 360/96.5 |
| 4,642,714 A | 2/1987 | Miyamoto | 360/96.5 |
| 4,644,414 A | 2/1987 | Yamada et al. | 360/10.2 |
| 4,651,239 A | 3/1987 | Omori et al. | 360/77 |
| 4,654,731 A | 3/1987 | Froschl et al. | 360/96.5 |
| 4,663,673 A | 5/1987 | Doutsubo | 360/9.1 |
| 4,665,447 A | 5/1987 | Odaka | 360/77 |
| 4,677,504 A | 6/1987 | Yamazaki et al. | 360/77 |
| 4,680,654 A | 7/1987 | Shibuya | 360/96.5 |
| 4,682,247 A | 7/1987 | Doutsbo | 360/10.2 |
| 4,688,109 A | 8/1987 | Sangu | 360/10.2 |
| 4,703,373 A | 10/1987 | Oosaka | 360/97 |
| 4,714,971 A | 12/1987 | Sigiki et al. | 360/77 |
| 4,717,974 A | 1/1988 | Baumeister | 360/64 |
| 4,731,878 A | 3/1988 | Takeuchi | 360/40 |
| 4,737,865 A | 4/1988 | Murakami et al. | 360/14.1 |
| 4,739,420 A | 4/1988 | Odaka et al. | 360/77 |
| 4,757,911 A | 7/1988 | Nakano et al. | 360/64 |
| 4,758,904 A | 7/1988 | Takashashi et al. | 360/19.1 |
| 4,760,474 A | 7/1988 | Takimoto | 360/64 |
| 4,769,811 A | 9/1988 | Eckberg, Jr. et al. | 370/60 |
| 4,774,605 A | 9/1988 | Kato | 360/72.2 |
| 4,786,011 A | 11/1988 | Fujiwara et al. | 242/195 |
| 4,796,115 A | 1/1989 | Ohshima et al. | 360/85 |
| 4,799,221 A | 1/1989 | Fukami et al. | 371/38 |
| 4,802,172 A | 1/1989 | Fukami et al. | 371/38 |
| 4,812,924 A | 3/1989 | Fukami et al. | 360/32 |
| 4,821,129 A | 4/1989 | Culp | 360/74.4 |
| 4,835,628 A | 5/1989 | Hinz et al. | 360/48 |
| 4,843,495 A | 6/1989 | Georgis et al. | 360/77.15 |
| 4,845,577 A | 7/1989 | Georgis et al. | 360/72.2 |
| 4,897,739 A | 1/1990 | Hasegawa et al. | 360/37.1 |
| 4,908,826 A | 3/1990 | Hertrich | 371/40.1 |
| 4,918,546 A | 4/1990 | Saito | 360/77.13 |
| 4,930,027 A | 5/1990 | Steele et al. | 360/70 |
| 4,933,784 A | 6/1990 | Oldershaw et al. | 360/77.16 |
| 4,935,824 A | 6/1990 | Nakano et al. | 360/48 |
| 4,935,827 A | 6/1990 | Oldershaw et al. | 360/77.16 |
| 4,970,612 A | 11/1990 | Renders et al. | 360/95 |
| 4,977,469 A | 12/1990 | Yokozawa | 360/77.01 |
| 4,984,104 A | 1/1991 | Takahashi et al. | 360/77.14 |
| 5,003,411 A | 3/1991 | Nagahara et al. | 360/72.2 |
| 5,034,833 A | 7/1991 | Marlowe | 360/96.5 |
| 5,050,018 A | 9/1991 | Georgis et al. | 360/77.16 |
| 5,068,757 A | 11/1991 | Hughes et al. | 360/77.16 |
| 5,103,355 A | 4/1992 | Steele | 360/77.13 |
| 5,115,500 A | 5/1992 | Larsen | 395/425 |
| 5,142,422 A | 8/1992 | Zook et al. | 360/54 |
| 5,191,491 A | 3/1993 | Zweiighaft | 360/77.13 |
| 5,251,077 A | 10/1993 | Saitoh | 360/54 |
| 5,262,905 A | 11/1993 | Takagi et al. | 360/53 |
| 5,327,305 A | 7/1994 | Thomas | 360/74.5 |
| 5,349,481 A | 9/1994 | Kauffman et al. | 360/74.4 |
| 5,369,652 A | 11/1994 | Bailey et al. | 371/40.1 |
| 5,371,745 A * | 12/1994 | Kiyonaga et al. | 371/13 |
| 5,392,299 A * | 2/1995 | Rhines et al. | 371/37.5 |
| 5,414,570 A | 5/1995 | Fry et al. | 360/48 |
| 5,535,068 A | 7/1996 | Hughes | 360/73.04 |
| 5,602,694 A | 2/1997 | Miles et al. | 360/84 |
| 5,633,764 A | 5/1997 | Ohta | 360/7 |
| 5,781,688 A | 7/1998 | Seong | 386/79 |
| 5,872,997 A | 2/1999 | Golson | 395/872 |
| 5,953,177 A | 9/1999 | Hughes | |
| 6,048,090 A * | 4/2000 | Zook | 371/37.4 |
| 6,052,815 A * | 4/2000 | Zook | 714/758 |
| 6,061,760 A * | 5/2000 | Huang | 711/112 |
| 6,272,659 B1 * | 8/2001 | Zook | 714/774 |

* cited by examiner

MULTI-LEVEL ERROR DETECTION AND CORRECTION TECHNIQUE FOR DATA STORAGE RECORDING DEVICE

RELATED PATENTS

The present invention is related to U.S. patent application entitled "Variable Speed Recording Method and Apparatus for a Magnetic Tape Drive", invented by Beavers et al., and having an internal Ser. No. 09/176,079, filed concurrently herewith on Oct. 20, 1998, and U.S. patent application entitled "Fine Granularity Rewrite Method and Apparatus for Data Storage Device", invented by Zaczek, and having an internal Ser. No. 09/176,015, filed concurrently herewith on Oct. 20, 1998, and U.S. patent application entitled "Overscan Helical Scan Head for Non-Tracking Tape Subsystems Reading at up to 1×Speed and Method for Simulation of Same", invented by Blatchley et al., and having Ser. Nos. 086/104; 09/176,013, filed concurrently herewith on Oct. 20, 1998, all of which are commonly owned and all of which are hereby incorporated by reference, and U.S. patent application entitled "Method And Apparatus For Logically Rejecting Previously Recorded Track Residue From Magnetic Media", invented by McAuliffe et al., and having a Ser. No. 09/192,794, filed on Nov. 16, 1998, and U.S. patent application entitled "Method And System For Monitoring And Adjusting Tape Position Using Control Data Packets", invented by McAuliffe et al., and having a Ser. No. 09/193,030, filed on Nov. 16, 1998, and U.S. patent application entitled "Rogue Packet Detection And Correction Method For Data Storage Device", invented by McAuliffe et al., and having a Ser. No. 09/192,809, filed on Nov. 16, 1998, and U.S. patent application entitled "A Method Of Reacquiring Clock Synchronization On A Non-Tracking Helical Scan Tape Device", invented by Blatchley et al., and having a Ser. No. 09/192,808, filed on Nov. 16, 1998.

FIELD OF THE INVENTION

The present invention pertains generally to data integrity in data recording/recovery devices, and more particularly to a multi-level error detection and correction technique.

BACKGROUND OF THE INVENTION

Data storage devices, which are used in both short- and long-term capacities, are an integral part of modern computer systems. While factors such as costs, device form factor, storage media size and capacity, and recording and recovery times are of high importance, of primary concern is the ability to maintain data integrity.

Techniques have been developed to detect and even correct data errors. In one technique, a cyclical redundancy code (CRC) is generated over the data and recorded along with the data to the storage media. During the recovery of the data from the storage media during a later session, the CRC is regenerated from the recovered data and compared to the recorded CRC accompanying the data to determine whether or not the data contains an error. CRCs are useful in detection of errors; however, they do not indicate the location of the error.

Error correction code (ECC) techniques have been developed in response to this problem. As the name implies, ECC techniques not only detect data errors, but they are also used to correct errors. One powerful error detection technique in common use is known as the Reed-Solomon error correction code.

As with the CRC code, an ECC is often generated over, and stored along with, the data to be recorded to the storage media. Upon recovery of the data, the recovered data and accompanying recorded ECC are sent through the ECC generator, which detects and corrects up to a certain number of errors in the recovered data.

Storage device manufacturers conventionally employ CRC and ECC techniques, at least to some degree, in the design of the data format and associated read/write logic to ensure data integrity. Typically, only a single or at most double level of error correction is performed. If bad data is detected and cannot be corrected using the single- or double-level ECC techniques, the data must be re-read from the storage medium to attempt once again to recover it. At the very least, this is a time-consuming process. Depending on the media type, this can also cause damage to the media itself, as in the case of magnetic tape devices where re-reads require a backhitching sequence that causes wear on the magnetic tape. Accordingly, a need exists for a more robust data recovery and error correction technique to maximize the number of data errors that can be corrected without having to re-read the data.

In addition, because recovered data is typically sent to the host system in pre-defined blocks of data of ordered addresses, the inability to recover a single or a few data bytes within a given block of data delays the delivery of the entire block of data to the host until the "missing" data is corrected or recovered. Accordingly, in systems with only single- or double-layer error correction, more of the data must be recovered from the storage media itself as actual good data. As previously mentioned, if error correction cannot correct the recovered data using the single- or double-layer error correction techniques of the device, the data must be re-read from the storage media, causing significant delay to the host in recovering the data. Accordingly, a need also exists for a technique for increasing the error correction rate in order to reduce the number of re-reads from the storage medium.

SUMMARY OF THE INVENTION

The present invention is a novel method and apparatus for providing multi-level error correction for data stored on a storage medium. In accordance with the invention, error correction is performed on data packets recovered from the storage medium at both the packet level and at the segment level. Segment level error correction is performed over multiple instances of multiple patterns of buffer packets located in the buffer to correct (i.e., generate) missing packets not yet read from the storage medium.

The invention reduces the number of re-reads of data from the storage medium by providing very powerful multi-level error correction of the data read during the first pass. The ability to generate missing packets from recovered good packets already present in the data buffer reduces the need to backhitch and actually reread data that was not properly detected during the first pass of the read head(s) over the track packet. A reduced number of backhitching sequences results in improved data recovery time as seen by the host.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A multi-layer error correction technique for reconstructing "missing" data packets, and thereby providing increased data integrity and increased data recovery time as seen by the host, for a recording/recovery device is described in detail hereinafter.

Figure 1:
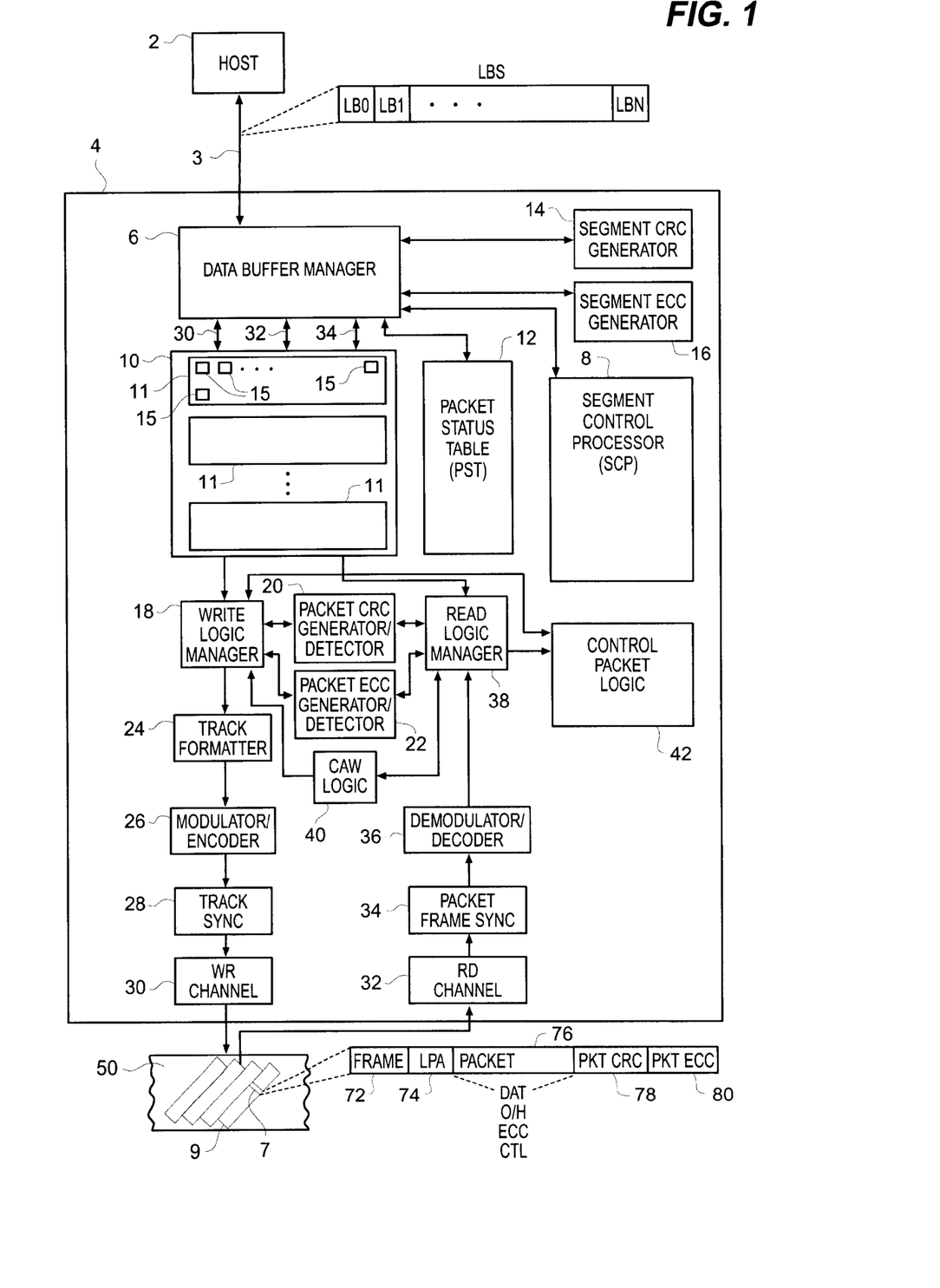
FIG. 1 is a system diagram of a data recording/recovery device in which the invention operates.

FIG. 1 is an illustrative embodiment of a data storage system in which the present invention operates. In the recording of data onto a storage medium 50, user data 3 is typically transferred to and from a recording/recovery device 4 by a host system 2 in variable length logical block sets 3. Each logical block set (LBS) 3 is a collection of user data bytes that contain a variable number of logical blocks (LB0, LB1, ..., LBN). Each logical block (LB) is defined within its LBS by a unique logical block address (LBA).

LBS data 3 is partitioned into a number of fixed-sized data packets 30 by a data buffer manager 6 and placed within a buffer packet 15 in a data buffer 10 until being transferred to the storage medium 50.

When the time comes to record a buffer packet 15 or control packet 36 onto the storage medium 50, write logic manager 18 determines the local packet address (LPA) of the buffer packet 15 and then causes packet CRC generator 20 to generate a packet cyclical redundancy code (CRC) over the track packet and LPA. Write logic manager 18 then causes packet ECC generator 22 to generate a packet ECC over the packet, LPA, and packet CRC. Write logic manager 18 formats the packet, LPA, packet CRC, packet ECC, and framing information into a track packet 7. The LPA comprises the address of the location of the packet in the segment 11. If the packet is a control packet 36, the LPA contains information pertaining to the type of control packet that it is. A track formatter 24 receives formatted track packets 7 from write logic manager 18, and formats them into tracks. A modulator/encoder 26 encodes and modulates the formatted track using, for example, a (1,6) Run Length Limited (RLL) channel modulation code into a 14-bit codeword. A track synchronization signal is added to the start of each track by track synchronization signal generator 28, and the track is then sent to a write channel 29 to be recorded onto storage medium 50.

Track packets 7 are recorded onto a storage medium 50 in tracks 9. Multiple track packets 7 exist on each track 9. In the illustrative embodiment, each track packet 7 is a fixed size and includes framing information 72, a local packet address field 74, a packet field 76, a packet CRC field 78, and a packet ECC field 80.

During a recovery session, track packets 7 are detected by read channel 32. A packet frame synchronizer 34 uses the framing information 72 to detect the leading edge of a track packet 7. Framing information 72 is a unique signal that is sent between track packets 7 in the channel domain to provide synchronization for track packet detection. This signal does not obey the run-length restriction of the channel modulation code and does not have a byte symbol associated with it, meaning that it is not decoded to a byte symbol by demodulator/decoder 36. In the illustrative embodiment, the packet framing signal is 16 bit cells long and is a 4, 8, 4 pattern.

A demodulator/decoder 36 demodulates and decodes the packet 7. A read logic manager uses the local packet address field 74 to first determine whether the track packet 7 contains a control packet. The handling of control packets is performed by control packet processor 42 (discussed hereinafter). If the track packet 17 does not contain a control packet, it contains either a data packet 30, an overhead packet 32, or a segment ECC packet 34. Read logic manager 38 uses the local packet address 74 along with the current global segment address (discussed hereinafter with respect to control packets) to determine the correct location of the track packet in the buffer 10. Read logic manager 38, in conjunction with packet CRC generator/error detector 20, uses the packet CRC field 78 to detect whether track packet 7 contains any errors. If track packet 7 contains any errors, read logic manager 38, in conjunction with packet ECC generator/error corrector 22, uses the packet ECC field 80 to detect and correct track packet 7 errors. If the track packet 7 is good or has been corrected, read logic manager 38 extracts the contents of packet field 76 and send it to it proper location in the buffer 10.

Control packets 36 are generated during a recording session by a control packet processor 42, and contain information relating to the position of the media (such as beginning- or end-of-media), the beginning and or ending of files or data (e.g., filemarks, tapemarks, end-of-data marks), global address information (e.g., the global segment address of data surrounding the control packet), and system information (such as device control code). During a recovery session, control packets 36 are processed by control packet processor 42 to determine the position of the storage media and where to place recovered data packets, buffer overhead packets, and segment ECC packets in the data buffer.

Certain control packets that are periodically placed along the tracks of the storage medium contain a global segment address. Control packet process 42 extracts the global segment address from these control packets and maintains a current global segment address. The global segment address (GSA) addresses each segment 11 boundary in the data buffer 10 which corresponds to a physical segment on tape. In the preferred embodiment, as discussed hereinafter, the data buffer 10 comprises six buffer segments 11. The GSA is a 24-bit number that spans an address range of $2^{24}$ segments 11, which covers the entire span of the storage media. The lower 5 bits of the current GSA are shared by the upper 5 bits of the local packet address (LPA) field 74 of a track packet. The upper two bits of the LPA allow for a four-segment aliasing. In other words, the tape must physically move the equivalent of four memory buffers before LPAs begin to repeat. It will be appreciated by those skilled in the art that this addressing scheme, namely the inclusion of a local packet address in each packet and the availability of an associated global segment address periodically written nearby its associated packets, provides a method for unambiguously indicating the correct location of a packet in a segment 11 of the data buffer 10 while reducing the overhead at the track packet level.

Figure 2:
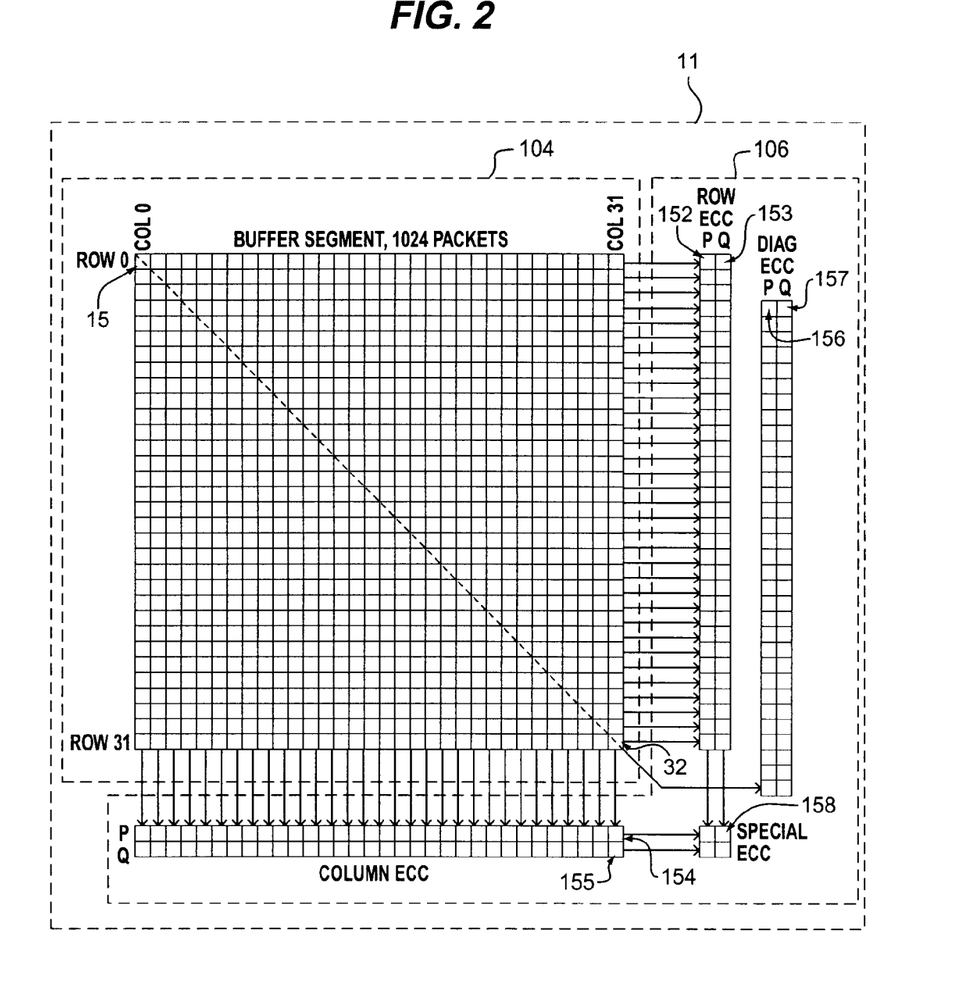
FIG. 2 is a diagram illustrating one embodiment of the contents and organization of a segment of a multi-segment data buffer implemented in accordance with the invention.

FIG. 2 illustrates one embodiment of the contents and organization of a segment 11 of a multi-segment data buffer 10 implemented in accordance with the invention. In this embodiment, segment 11 comprises a set of fixed-size buffer packets 15, each belonging to either a data/overhead area 104 or a segment ECC area 106. In the illustrative embodiment, the data/overhead area 104 comprises 114 packets 15 of 64 bytes each, and arranged in a 32-by-32 array. Packets 15 in the data/overhead area 104 contain either data packets 30 or overhead packets 32. Overhead packets 32 are used to locate the positions of where the LBS's 3 start and end in the segment 11. Typically only one packet 15, called the key overhead packet 32, is used for overhead in a segment 11 so that, in the illustrative embodiment, there are approximately 384 Kbytes (113*64*6=392,832 bytes) available in the buffer 10 for LBS data 3 in the best case.

Figure 3A:
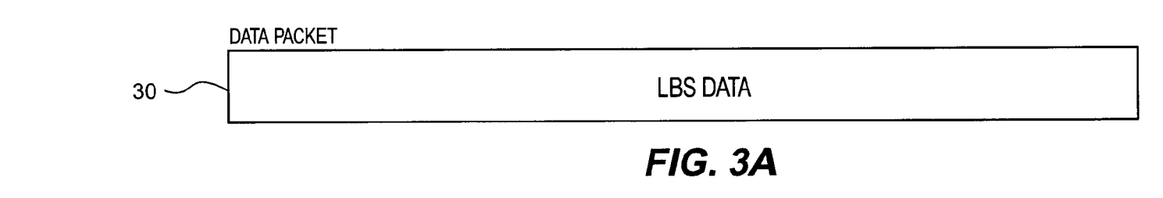
FIG. 3(a) is a diagram of a data packet completely filled with user data.
Figure 3B:
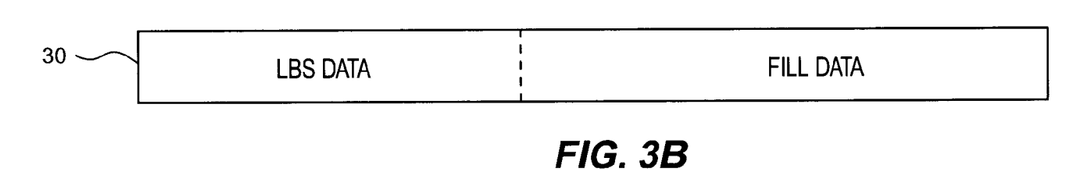
FIG. 3(b) is a diagram of a data packet filled partially with user data and padded with fill data.

As just described, a packet 15 residing in the data/overhead area 104 of segment 11 contains either a data packet 30 or a overhead packet 32. Each data packet 30 is either completely filled with LBS data, as illustrated in FIG. 3(a) or contains LBS data followed by "fill" data, as illustrated in FIG. 3(b). Accordingly, in the illustrative embodiment, when the number of LBS data bytes are not exactly divisible by 64, the last data packet 30 of a given LBS 3 is padded out with don't-care "fill" data. Every LBS 3 begins at the beginning of a data packet 30 boundary, and each data packet 30 contains no more than one LBS.

Data/overhead area 104 of segment 11 also contains at least one overhead packet 32. Overhead packets 32 contain overhead information about the LBS's 3 that are stored in the segment 11. This information includes the location of all junctions between LBS's 3 residing in the segment 11, the logical block address (LBA) of the first LBS 3 to start in the segment 11, the size and number of logical blocks (LB's) within each LBS 3 that starts in the segment 11, the tape partition, volume initialization count, compression mode indicator, segment flush indicator, and the segment CRC.

Due to the allowance of variable LBS sizes, the number of overhead packets 32 in a given segment 11 is variable and depends on the number of LBS's that reside in the same segment. The variable overhead scheme optimizes the segment overhead space used. Each segment 11 contains at least one overhead packet 32, called the key overhead packet 32. In the illustrative embodiment, the key overhead packet 32 always occupies the last packet location of the segment (in the illustrative embodiment, row 31, column 31). If there are less than seven LBS junctions within the segment 11, the key overhead packet 32 is the only overhead packet 32 in the segment 11 and the LBS data can occupy up to the next to last packet location (row 31, column 30). For every up to eight additional LBS junctions that exist in the segment 11, an additional overhead packet 32 is present in the segment 11. The overhead packets 32 grow backwards in row 31 until the entire last row of the segment 11 is occupied with overhead packets 32. Accordingly, in the illustrative embodiment, the maximum number of LBS junctions that can exist in one segment 11 is 147.

Figure 4A:
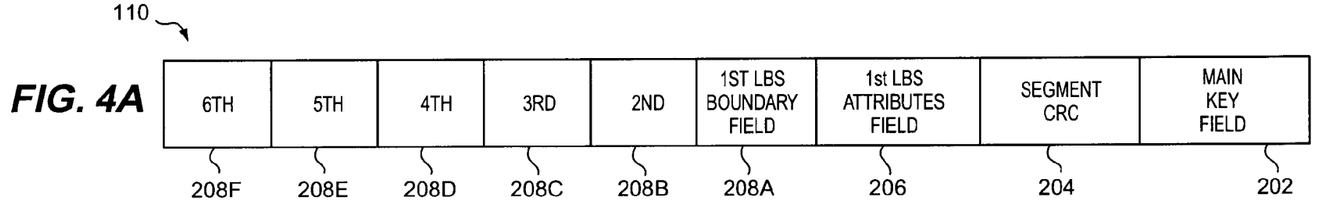
FIGS. 4(a)–4(d) illustrate one embodiment of key overhead packet.

FIG. 4(a) illustrates one embodiment of key overhead packet 32. In this embodiment, key overhead packet 32 occupies 64 bytes, comprising nine separate fields. These fields include a main key field 202, the segment CRC field 204, a first LBS attributes field 206, and six LBS boundary fields 208a–208f. Each field 202, 204, 206, and 208a–208f include an 8-bit CRC associated with them for error detection across their field.

For any segment 11 containing LBS data, the segment CRC 204 and main key field 202 and first LBS attributes field 206 are always valid. The information in the main key field 202 determines which of the other overhead fields in the key overhead packet 32 are valid.

Figure 4B:
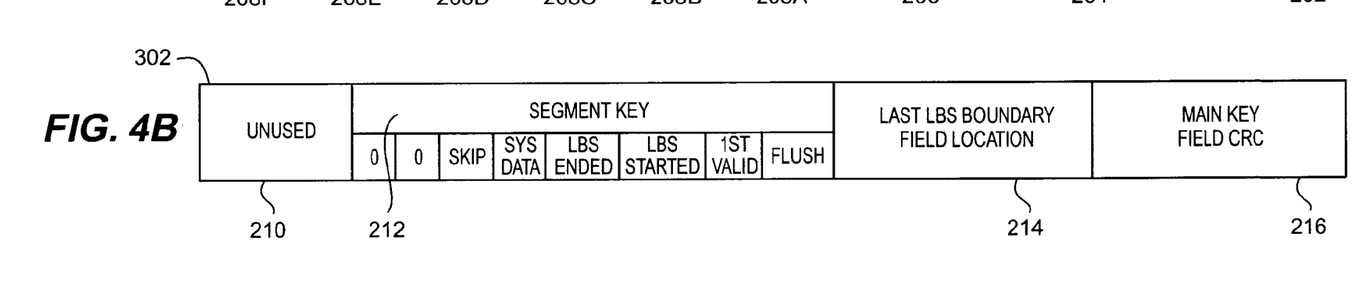

FIG. 4(b) illustrates one embodiment of the main key field 202 in key overhead packet 32. Main key field 202 occupies four bytes including one unused byte 210, a segment key 212, the location of the last LBS boundary 214, and the main key field CRC 216.

The segment key 212 include bits SKIP, SYS DATA, LBS ENDED, LBS STARTED and FLUSH, which are used for conveying key information about the LBS's that are stored in the segment 11. Normally, the last used overhead packet 32 is adjacent to the last data packet 30 in the segment 11, except for when the segment 11 is flushed or when a single unused packet 15 is skipped. SKIP bit is set to indicate the latter case. SYS DATA is set to indicate that the LBS data in this segment 11 is not user logical block data but rather system data. System data may include data created by the drive used to store control information such as locations of filemarks, directory structure, and logical format information as controlled by software. LBS ENDED bit is set only when at least one LBS 3 has an endpoint residing in this segment 11. LBS STARTED bit is set only when at least one LBS 3 has a starting point in this segment 11. FLUSH bit is set to indicate that the segment 11 has been flushed, as described hereinafter.

Referring back to FIG. 4(b), the main key field 202 also includes a last LBS boundary field location 214. This is an 8-bit value which locates the last LBS boundary field location within the overhead area of the segment 11. Five bits are used to indicate which column of row 31 the overhead packet 32 that contains this field is located. The remaining three bits are intra-packet (IPK) bits used to specify one of eight starting addresses within the 64-byte data packet where the last LBS boundary field begins.

The main key field 202 includes an 8-bit CRC field 216 which is used to store the CRC calculated across the main key field 202. In the illustrative embodiment, the CRC polynomial is: X[8]+X[7]+X[2]+X[0].

Key overhead packet 200 in FIG. 4(a) also includes a segment CRC field 204. In the illustrative embodiment, segment CRC 204 is a 4-byte CRC used for storing the segment post-correction error detection, and is discussed hereinafter.

Figure 4C:
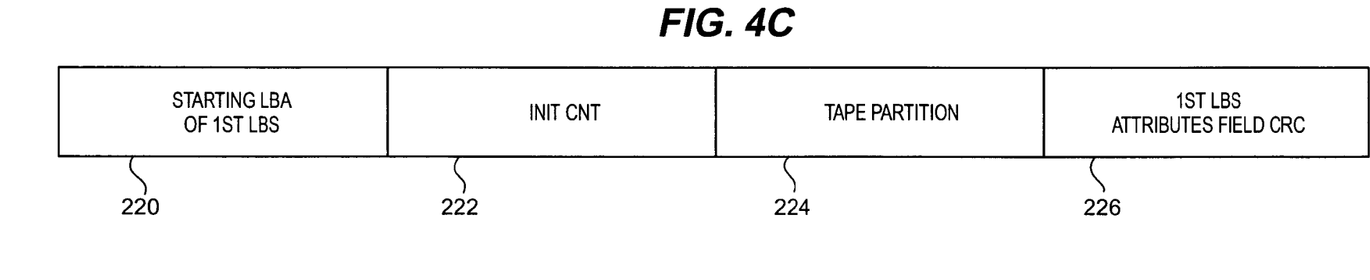

Key overhead packet 200 also includes a first LBS attributes field 206. One embodiment, illustrated in FIG. 4(c), includes a four-byte field 220 containing the logical block address (LBA) of the first LBS 3 to have a starting point in this segment 11, a two-byte field 222 containing the tape initialization count, a single-byte field 224 containing the tape partition number, and an 8-bit CRC field 226 used for error detection over the entire first LBS attributes field 206. The CRC polynomial in the illustrative embodiment is: X[8]+X[7]+X[2]+X[0].

Figure 4D:
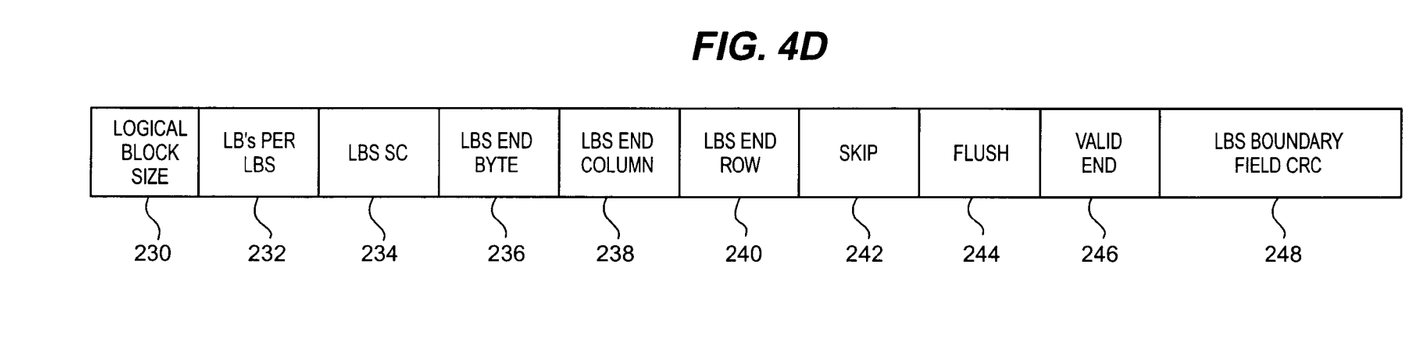

Key overhead packet 32 may also include one and up to six LBS boundary fields 208a308f. FIG. 4(d) illustrates one embodiment of the format of an LBS boundary field 208, including a logical block size field 230, a number of logical blocks per LBS field 232, a logical block compression mode (LBSC) indicator 234, an LBS endpoint location 236, 238, 240, a skip indicator 242, a flush indicator 244, an endpoint valid indicator 246, and an LBS boundary field CRC 248. Logical block size field 230 occupies 18 bits in the illustrative embodiment and specifies the size of the logical blocks (LB) 104 stored within the logical block set (LBS) 3. The number of logical blocks per LBS field 232 occupies 13 bits and specifies how many LB's 104 are stored within the LBS 3. The logical block compression mode (LBSC) indicator 234 is set only when the LBS 3 has been compressed by compression hardware 116. The location of a valid LBS endpoint is determined using a 6-bit LBS endpoint byte field 236, a 5-bit LBS endpoint column field 238, and a 5-bit LBS endpoint row field 240, in combination with endpoint validity indicator VALID END 246. Only if the VALID END indicator 246 is set is the endpoint location valid. An example of a valid LBS boundary field 208 having an invalid endpoint would be for an LBS 3 that started in this segment 11 but ended in the next segment. The skip indicator 242 is set only if there is a single unused packet 15 after the endpoint. LBS boundary field CRC 248 contains the CRC calculated over the entire 8-byte LBS boundary field 208, using the polynomial: $X[8]+X[7]+X[2]+X[0]$.

Not all LBS boundary fields 208a–308f are valid in a given overhead packet 32. The main key field 202 in the overhead packet 32 points to the last valid LBS boundary field 208 within the overhead packet 32. Also, if an LBS 3 starts in a segment 11 but does not end in the same segment 11, the last four bytes of the endpoint are not valid, but the first four bytes are valid. The FIRST VALID bit in the segment key field 212 in the main key field 202 of the key overhead packet 32 indicates that the first LBS that starts in the segment starts in the very first location of the segment (e.g., address 0).

Referring back to FIG. 2, segment 11 comprises a set of packets 15 organized into a segment ECC area 106. Segment ECC area 106 includes pairs P and Q of different redundancy code row ECC packets 152, 153, column ECC packets 154, 155, diagonal ECC packets 156, 157, and a set of "special" ECC packets 158. The row, column, diagonal and special ECC packets in the segment ECC area 106 are used to provide four-level error correction protection over the entire segment 11. During a recording session, the contents of the packets 152–158 in the segment ECC area 106 are generated, under the control of data buffer manager 6, from the data packets 30 and overhead packets 32 residing in the segment data area 104 and provide for correction of the data area packets 30 during a recovery session.

In the illustrative embodiment, each buffer segment 11 utilizes a 32-bit (4-byte) CRC for error detection and a multiple-layer Reed-Solomon scheme for error correction. As described previously, a 32-bit CRC used for segment post-correction error detection is stored in the segment CRC field 204 of the segment key overhead packet 32. All of the data packets 30 residing in the segment data/overhead area 104 of a segment 11 are divided by a CRC generator polynomial implemented in the CRC generator 14 to produce the 4-byte CRC. The last data packet 30 of the segment 11 (which may contain fill data if an LBS ends in it) is always used as a complete segment in this calculation. Overhead packets 32 and skipped packets 15 are not included in the CRC calculation. In the illustrative embodiment, the polynomial used to calculate the segment CRC 304 is:

$X[32]+X[26]+X[23]+X[22]+X[16]+X[12]X[11]+X[10]+X[8]+X[7]+X[5]+X[4]+X[2]+X[1]+X[0]$.

Multi-layer redundancy is provided by pair s P and Q of redundant codes generated over a plurality of patterns of packets 15 of a segment 11 of buffer 10. In the illustrative embodiment, the plurality of patterns include rows, columns, and diagonals. Other patterns may be used. In addition, error correction is performed over all of the first redundant codes P for both row and column ECC codes, and all of the second redundant codes Q for both row and column ECC codes to generate special ECC codes 158.

Segment correction processor 8 includes a Reed-Solomon Syndrome generator and correction circuit that provides for a one- or two-packet correction in any row, column, or diagonal of the data/overhead area 104 of segment 11 by using erasure pointers. An erasure pointer is a pointer to a location of a missing packet that is treated as if it has been erased such that the data is all zeros. Erasure pointers are set by the SCP 8. Erasure pointers result from missing or uncorrectable data/overhead/segment ECC packets 30, 32, 34. Additionally, row ECC packets 152,153 and column ECC packets 154,155 can be corrected by a fourth level of correction provided in "special" ECC packets 158. Accordingly, four levels of error correction at the segment level occur.

Row redundancy is provided by row ECC packets P 152 and Q 153 for each row (0 through 31) of data/overhead area 104 of buffer segment 11. In the illustrative embodiment, the entire 32-packet-by-32-packet data/overhead area 104 of the buffer segment 11 is used to generate row ECC redundancy. Each of the 32 rows of packets 30 in the data/overhead area 104 is used to generate two unique redundant code row ECC packets P 152 and Q 153. Segment ECC generator 16 creates a byte in each of the two row ECC packets P 152 and Q 153 from the associated bytes of all the same-row packets 30. For example, byte address zero of each row ECC packet P 152 and Q 153 for row 5 is generated from all the byte address zero locations of the data packets 30 in row 5.

Similarly, column redundancy is provided by column ECC packets P 154 and Q 155 for each column (0 through 31) of data/overhead area 104 of buffer segment 11. In the illustrative embodiment, the entire 32-packet-by-32-packet data/overhead area 104 of the buffer segment 11 is used to generate column ECC redundancy. Each of the 32 columns of packets 30 in the data/overhead area 104 is used to generate two unique redundant codes in column ECC packets P 154 and Q 155.

Diagonal redundancy is provided by diagonal ECC packets P 156 and Q 156 for each diagonal (0 through 31) of data/overhead area 104 of buffer segment 11. The diagonals are defined to each include 32 packets. In one embodiment, a given diagonal N starts at column 0 and row N, and the next element of the diagonal is found by incrementing both the current column number and current row number, modulo 32. Table 1 illustrates the calculation of the diagonals for this embodiment.

TABLE 1

| DIAGONAL # | STARTING ROW | STARTING COLUMN | ENDING ROW | ENDING COLUMN |
| --- | --- | --- | --- | --- |
| 0 | 0 | 0 | 31 | 31 |
| 1 | 1 | 0 | 0 | 31 |
| 2 | 2 | 0 | 1 | 31 |
| N | N | 0 | N-1 | 31 |

Four special ECC packets 158 are generated from the 64 column ECC packets. These four special ECC packets 158 are used to correct missing row ECC packets 152, 153 or column ECC packets 154, 155.

Figure 5:
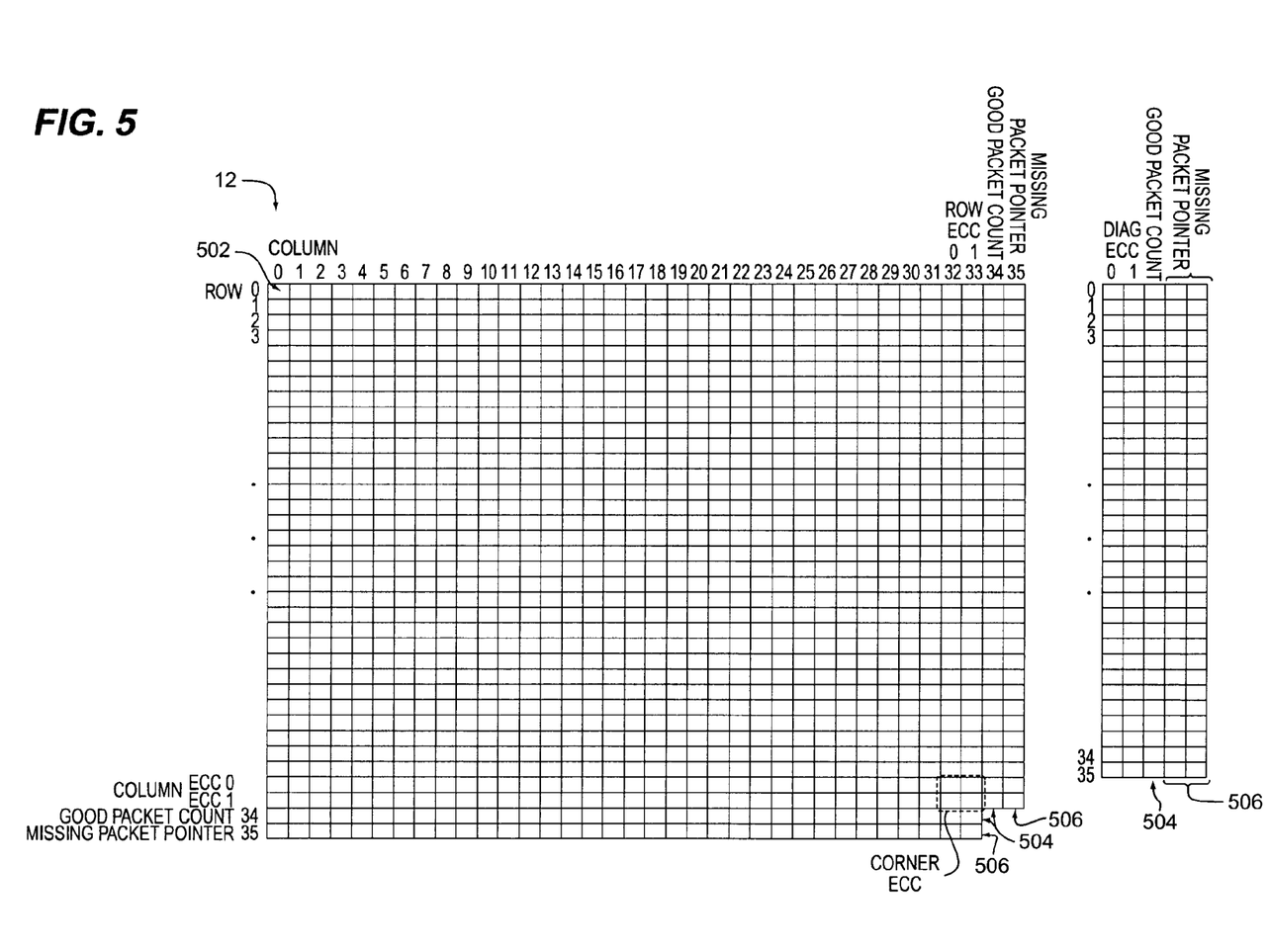
FIG. 5 is a diagram illustrating one embodiment of the contents and organization of a packet status table corresponding to the segment of FIG. 2

As data packets are recovered and placed into the data buffer 101 data buffer manager 6 updates a packet status table (PST) 12. Each segment 11 has a corresponding PST 12 which contains an entry corresponding to each buffer packet 15 in the segment 11. Each PST entry indicates: (1) whether the packet has been received and is good; (2) whether the packet was corrected by packet correction; (3) whether the packet was corrected by segment correction; and (4) whether the packet was corrected using either row, column, or diagonal ECC. In addition, each PST 12 contains a packet count containing the total number of good packets received for each instance of each pattern (i.e., each row, column, and diagonal). Each PST 12 also contains a total count which indicates the total number of good packets present in the segment 11. The counts are used by the SCP 8 to determine when correction can be applied to the segment. The SCP 8 manages all segment correction activities.

FIG. 5 is a diagram of a PST 12 corresponding to the segment 11 of FIG. 2. Each cell 502 of PST 12 comprises a byte. Bits of each cell byte are used to indicate the presence of a good packet at that location, and the different possibilities of the way in which it was corrected. Row, column, and diagonal good packet counts 504 are maintained for each row, column, and diagonal. Missing packet pointers 506 for each row, column, and diagonal are maintained for each row, column, and diagonal.

During a recovery session, the segment correction processor (SCP) is turned on (when the GS advances into a subsequent segment) to reconstruct packets that are as-yet "missing" from the buffer as they become reconstructable. For example, as a segment 11 begins to fill, if a row, column, or diagonal becomes full less one or two "missing" packets, the SCP 8 is able to reconstruct the missing packets. Because every packet lies in a row, column, and diagonal, the reconstruction of one or two missing packets along one of the three different patterns may fill out at least one of the other two patterns enough such that the missing packets located in that pattern can then be reconstructed. For example, if a row is missing only a single packet, error correction is performed on the entire row using the two unique redundancy code row ECC packets P 152 and Q 153 to reconstruct the missing packet. The reconstruction of the missing packet may fill out the diagonal that the reconstructed packet lies in enough that it is only missing a single other packet. Error correction is then performed on the reconstructed packet's diagonal to reconstruct the missing packet in the diagonal. This process continues until all of the packets in the segment are recovered or reconstructed.

Figure 6:
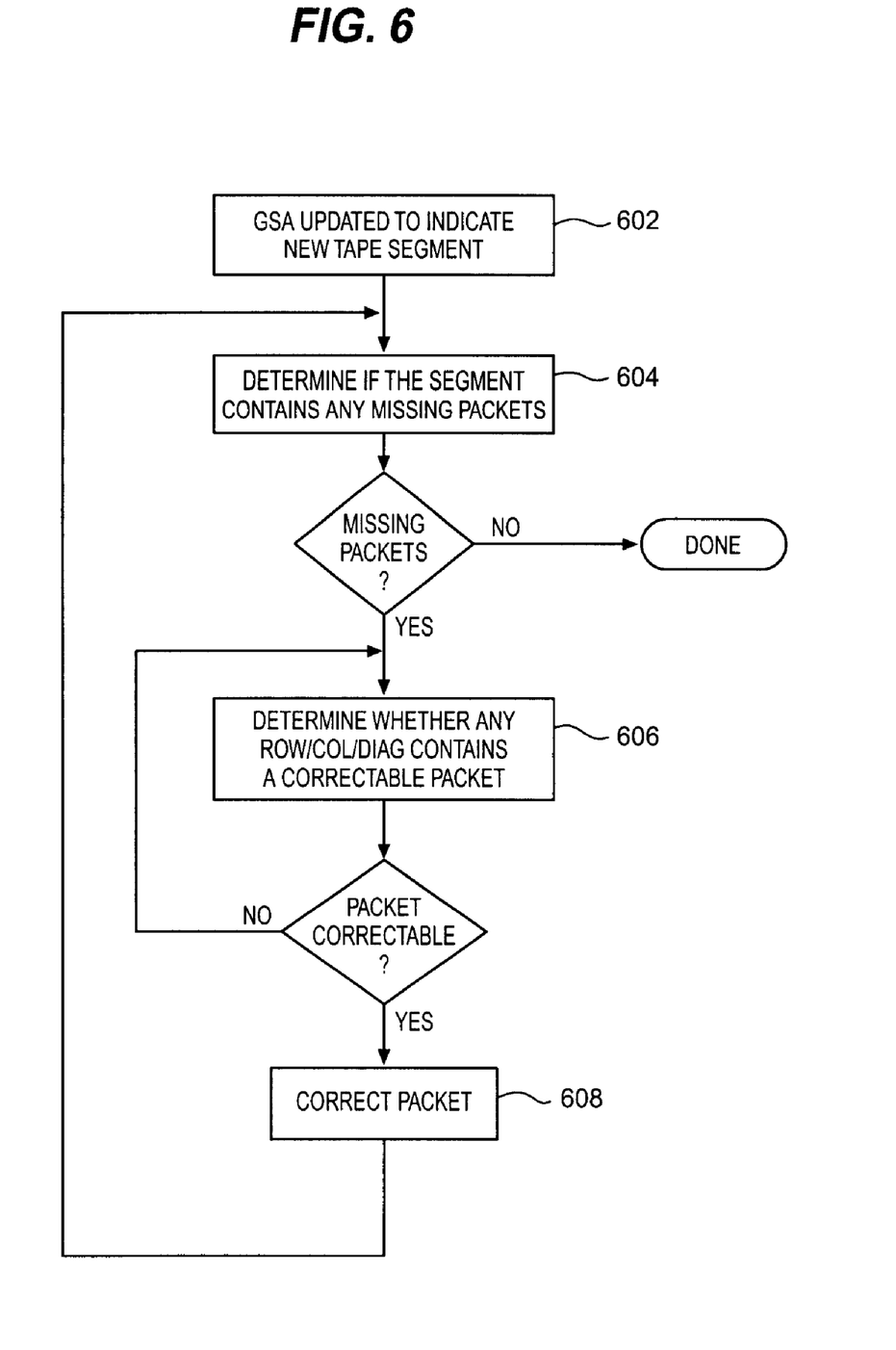
FIG. 6 is a flowchart illustrating one embodiment of a method for performing error correction during a recovery session in accordance with the invention.

FIG. 6 is a flowchart illustrating one embodiment of a method 600 for performing error correction during a recovery session as implemented in SCP. SCP is triggered in step 602 to begin segment correction by the detection of either a control packet or data packet recovered from tape that results in the updating of the current GSA to a new GSA. Once the SCP is triggered to begin, in step 604 SCP scans the PST to determine whether the buffer segment contains any missing packets. In the illustrative embodiment, the SCP scans the total packet count of each PST entry corresponding to each row, each column, and each diagonal. If all rows, columns, and diagonals have a total packet count of 32, all of the data packets are present and the contents of the segment are ready to be released to the host. This condition is signaled in step 610.

If any data packets are missing from the data buffer, in step 606 the SCP scans each instance of every predefined buffer packet pattern to determine whether any one or two packets is correctable. In the illustrative embodiment, SCP scans the total packet count 504 of each PST entry corresponding to each row, each column, and each diagonal. If any row, column, or diagonal has a total packet count 504 that is less by one or two of a total row/column/diagonal count, that particular row/column/diagonal instance is correctable to recover the missing packet(s) of that instance. Step 606 is repeated until a correctable instance is detected.

Once a correctable instance is detected, packet correction is performed in step 608. In the preferred embodiment, packet correction is performed by Reed-Solomon error correction code. The SCP 12 uses erasure correction for correcting either single- or two-packet errors. Using a Reed-Solomon correction code with two redundant code words provides the ability to locate a single error and correct it, or to correct two errors if the locations are known. To correct two errors, the known locations must be erased or reset to zero so that they do not contribute an error term to the syndrome calculations. This is referred to as erasure correction. In addition, it is possible to correct only one location with erasure correction. Steps 604–608 are repeated until all of the data packets are present in the segment, at which time this condition is signaled in step 610 and method 600 is complete.

As will be appreciated from the above detailed description of the invention, data integrity is preserved via multi-layer error correction—one layer at the packet level, and four layers at the segment level. As will be appreciated by those skilled in the art, the number of error correction layers can be increased or decreased simply by varying the number of buffer packet patterns over which error correction is to be performed. Also, the actual buffer packet patterns used when performing error correction may be varied from design to design while still employing the power error correction technique of the invention. For example, one or more of the plurality of buffer packet patterns may be a zig-zag or alternating buffer packet pattern instead of, or in addition to, a row, column or diagonal pattern.

Accordingly, although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. An apparatus for verifying data recovered from a storage medium, said apparatus comprising:
    a data buffer comprising:
        a plurality of buffer packets arranged in an array comprising a plurality of instances of a plurality of buffer packet patterns; and
        a plurality of buffer error correction code (ECC) packet sets each corresponding to a respective one of said plurality of instances of said plurality of buffer packet patterns, wherein each of said ECC packet sets is used for error correction and comprises one or more buffer ECC packets that each contain an error correction code generated over each of said buffer packets in said corresponding instance of said respective buffer ECC packet;
    a read logic manager which receives a packet recovered from said storage medium, said packet comprising either a data packet or an error correction code (ECC) packet, performs packet-level error detection and/or correction across said packet, and, only if said packet-level error detection/correction indicates that said packet is error-free, places said packet in a buffer packet in said data buffer if said packet is a data packet and places said packet in a buffer ECC packet in said data buffer if said packet is an ECC packet; and
    a control processor which detects the existence of a correctable instance, said correctable instance comprising one of said instances of said plurality of buffer packet patterns that comprises a missing yet reconstructable packet, and causes said correctable instance to be corrected.

2. An apparatus in accordance with claim 1, comprising:
a data buffer error correction code (ECC) generator responsive to said control processor which corrects said correctable instance.

3. An apparatus in accordance with claim 1, wherein:
said packet comprises a packet-level error correction code; and said apparatus comprising:
a packet level error corrector which corrects an error in said packet using said packet-level error correction code, before said packet is placed in said data buffer, if said packet contains an error.

4. An apparatus in accordance with claim 1, wherein:
said control processor detects and signals a data buffer ready condition, said data buffer ready condition indicating that each of said plurality of buffer packets in said data buffer contain correct data packets and each of said plurality of buffer ECC packets contain correct ECC packets.

5. An apparatus in accordance with claim 1, comprising:
a packet status table (PST), said PST comprising a PST entry corresponding to each of said plurality of buffer packets and each of said plurality of said buffer ECC packets, each said PST entry indicating whether said corresponding buffer packet or buffer ECC packet is correct.

6. An apparatus in accordance with claim 1, wherein said plurality of data buffer patterns comprise:
a plurality of rows, a plurality of columns, and a plurality of diagonals.

7. An apparatus in accordance with claim 6, wherein: said plurality of buffer error correction code (ECC) packets comprise:
a plurality of row error correction code (ECC) buffer packets, each mapped to a corresponding row, for storing a row ECC packet containing a row ECC generated over each of said buffer packets in said corresponding row;
a plurality of column ECC buffer packets, each mapped to a corresponding column, for storing a column ECC packet containing a column ECC generated over each of said buffer packets in said corresponding column;
a plurality of diagonal ECC buffer packets, each mapped to a corresponding diagonal for storing a diagonal ECC packet containing a diagonal ECC generated over each of said buffer packets in said corresponding diagonal.

8. An apparatus in accordance with claim 7, wherein:
said plurality of buffer error correction code (ECC) packets comprise:
a plurality of special error correction code (ECC) buffer packets, each mapped to a plurality of corresponding row ECC packets and column ECC packets, for storing a special ECC packet containing a special ECC generated over each of said corresponding row ECC packets and column ECC packets.

9. A storage medium for a recording/recovery device, said recording/recovery device comprising a data buffer, said data buffer comprising a plurality of buffer packets and a plurality of buffer error correction code (ECC) packets, said plurality of buffer packets comprising a plurality of instances of a plurality of buffer packet patterns, and said plurality of buffer ECC packets comprising a respective buffer ECC packet corresponding to each of a respective one of said plurality of instances of said plurality of buffer packet patterns and each containing an error correction code generated over each of said buffer packets in said corresponding instance of said respective buffer ECC packet, said storage medium comprising:
a plurality of data packets, each of which comprises a packet-level error correction code (ECC) generated across said packet and is mapped to one each of said plurality of buffer packets and belonging to one or more of said plurality of instances of said plurality of buffer packet patterns; and
a plurality of error correction code (ECC) packet sets, each corresponding to a respective one of said plurality of instances of said plurality of buffer packet patterns, wherein each of said ECC packet sets is used for error correction and comprises one or more of said buffer ECC packets that each contain an error correction code generated over each of said data packets mapped to said corresponding instance.

10. A storage medium in accordance with claim 9, wherein said plurality of data buffer patterns comprise:
a plurality of rows, a plurality of columns, and a plurality of diagonals.

11. A storage medium in accordance with claim 9, wherein:
each said plurality of data packets and each said plurality of ECC packets comprising a packet-level error correction code generated respectively across said data packet or said ECC packet.

12. A method for correcting missing data from a segment of a data buffer, said segment comprising a plurality of buffer packets and a plurality of error correction code (ECC) packets, said plurality of buffer packets being arranged in an array comprising a plurality of instances of a plurality of buffer packet patterns, and said plurality of ECC packets comprising a plurality of buffer error correction code (ECC) packet sets each corresponding to a respective one of said plurality of instances of said plurality of buffer packet patterns, wherein each of said ECC packet sets is used for error correction and comprises one or more buffer ECC packets that each contain an error correction code generated over each of said buffer packets in said corresponding instance of said respective buffer ECC packet, said method comprising:
determining whether any of said instances of said plurality of buffer packet patterns comprises a missing yet reconstructable packet;
reconstructing said missing yet reconstructable packet;
determining whether all of said buffer packets in said segment contain good data; and
repeating said first determining step through said second determining step if all of said buffer packets in said segment do not yet contain good data.

13. A method in accordance with claim 12, comprising:
maintaining a packet status table (PST), said PST comprising a PST entry corresponding to each of said plurality of buffer packets and each of said plurality of said buffer ECC packets, each said PST entry indicating whether said corresponding buffer packet or buffer ECC packet is correct.

* * * * *